United States Patent [19]

Wiltgen et al.

[11] Patent Number: 5,412,159

[45] Date of Patent: May 2, 1995

[54] HIGH VOLTAGE RESISTIVE NETWORK CIRCUIT BOARD WITH GOOD POTTING ADHESION

[75] Inventors: Bernard M. Wiltgen, Villa Park; Arthur J. Lostumo, Franklin Park, both of Ill.

[73] Assignee: Zenith Electronics Corporation, Glenview, Ill.

[21] Appl. No.: 127,398

[22] Filed: Sep. 27, 1993

[51] Int. Cl.[6] ............................................. H05K 1/00
[52] U.S. Cl. ........................... 174/250; 174/255; 174/256; 174/258; 361/762
[58] Field of Search ............... 174/250, 255, 256, 258, 174/268; 361/760, 762, 767

[56] References Cited

U.S. PATENT DOCUMENTS

| | | |
|---|---|---|
| 4,019,922 | 4/1977 | Whittum et al. . |
| 4,137,559 | 1/1979 | Reuting . |
| 4,440,972 | 4/1984 | Taylor . |
| 4,510,276 | 4/1985 | Leech et al. . |
| 4,923,908 | 5/1990 | Lostumo et al. ............... 523/220 |
| 5,247,423 | 9/1993 | Lin et al. . |

Primary Examiner—Leo P. Picard
Assistant Examiner—Cheryl R. Figlin
Attorney, Agent, or Firm—Roland W. Norris

[57] ABSTRACT

A thick film resistive network circuit board to be potted is given a surface coat of epoxy on one side which does not cover the solder pads or electrical connections, thereby allowing further working of the board. The epoxy coat is applied in such a fashion that it does not obscure or cover a second side of the board having a potentiometer network thereon in the preferred embodiment. The epoxy coat provides a good surface for adhesion of a potting epoxy as well as good adhesion to the board, and thereby prevents breakdown of the dielectric properties of the high voltage circuitry into which the board is fitted.

7 Claims, 2 Drawing Sheets

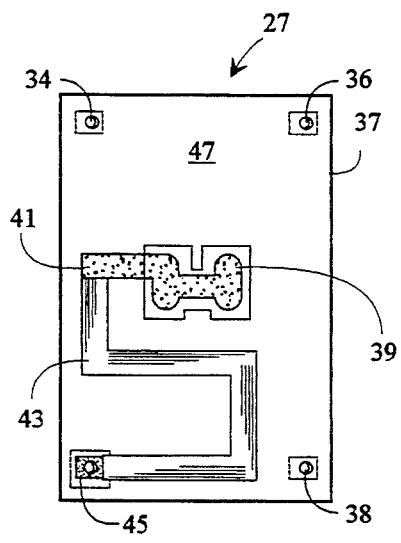
Fig. 2
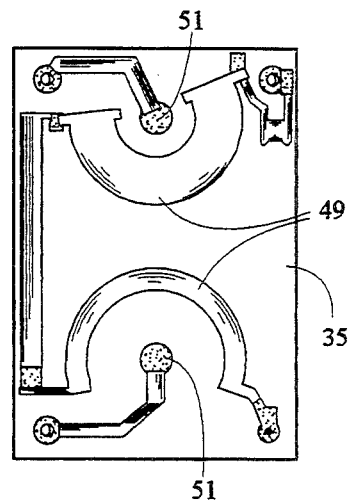
Fig. 3
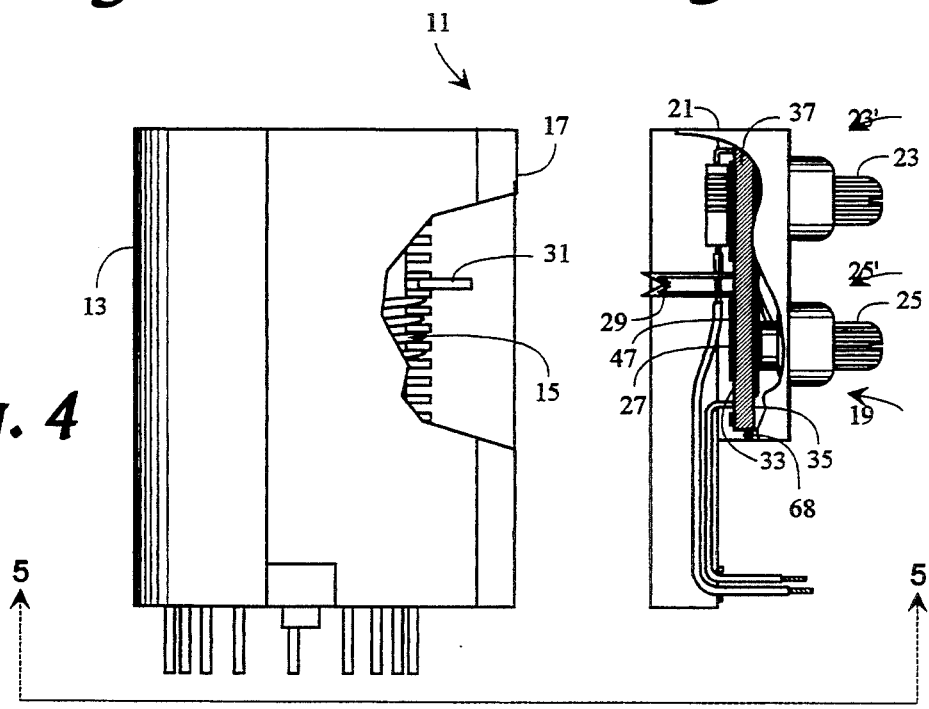
Fig. 4
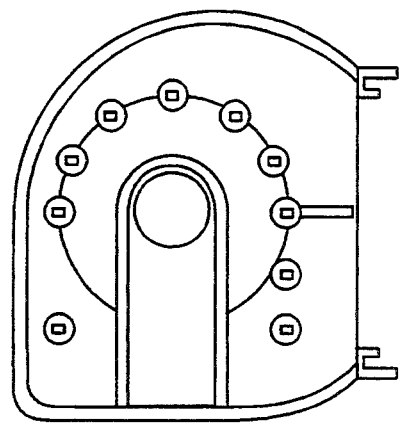
Fig. 5
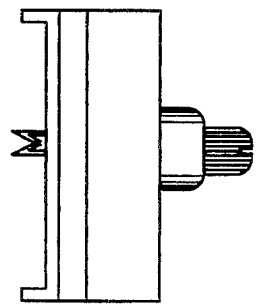

HIGH VOLTAGE RESISTIVE NETWORK CIRCUIT BOARD WITH GOOD POTTING ADHESION

FIELD OF THE INVENTION

The present invention relates generally to circuit boards used in potted circuits. The present invention relates more particularly to potted circuit boards having thick film resistive networks thereon, especially as used in conjunction with potted, high voltage sweep transformers in cathode ray tube displays.

DISCUSSION OF THE RELATED ART

High voltage electronic circuitry is often encased in dielectric, or nonconductive, materials. These circuits are called potted circuits and the process is called potting. The potting material is usually an epoxy. The potting is done to eliminate air gaps in the circuitry which could cause sparking or corona. Corona will eventually destroy the potting epoxy and result in failure of the potted circuit.

The subject electrical circuits are often contained on boards such as a ceramic substrate upon which a resistive thick film network and conductive runs and lands are affixed and to which electrical components are subsequently affixed. This circuit board is then inserted into a container and potted. However, if adhesion between the board and the potting epoxy is not good, the coefficients of thermal expansion of the board and the potting compound can be so different as to cause gaps to form between the potting compound and the board upon repeated heating and cooling cycles. Thus, air gaps can form and the resultant sparking or corona can cause failure of the potted circuit. Accordingly, the production of potted circuits requires good adhesion between the potting epoxy, often an organic acid anhydride cured epoxy resin, and the circuit board, often using a ceramic substrate such as alumina.

"Coupling Agents" may be used to chemically bond two materials, such as the substrate and the bulk potting epoxy, together. An amino silane is such a coupling agent capable of reacting with both the alumina substrate and the potting epoxy and is useful in certain applications.

However in the case of the aforementioned substrates with thick film resistive networks thereon a problem arises.

The resistive thick films, which are lead borosilicate glasses with ruthenium-oxide functional ingredients, are affixed to the ceramic substrate by firing of the applied thick film. If the firing conditions are not very carefully controlled, the ceramic substrate is randomly contaminated with lead oxides which are not easily removed. The silane coupling agent does not react with lead oxide and is, therefore, ineffective.

Therefore, another method is used for improving adhesion between the potting epoxy and the substrate of the thick film resistive circuit boards. That is the "tiecoat". A "tiecoat" is a material which exhibits good adhesion to two materials, which do not adhere well to one another. This "good adhesion" to the two materials is not necessarily achieved through primary chemically bonding, and is usually as a result of secondary bonding and/or mechanical adhesion. The typical tiecoat in the present context is a thin layer of epoxy chosen for its adhesive qualities to both the board and the potting epoxy.

In the past, tiecoats were applied to thick film resistive network circuit boards by fluid bed coating, which is a process whereby the heated circuit board, which has already been populated, i.e., has all its components in place, is placed in a tank of air-suspended, fine-powder epoxy. The heat from the board then causes the epoxy to "melt" and cover the whole board and the components thereon. It will be appreciated that this fluid bed coating technique is not appropriate where one wishes to further work the board as by soldering on additional components, or where one side of the board needs to be kept clean of the tiecoat. That is, fluid bed coating is not desirable where one does not wish to cover the entire surface of the board. While masking could be used, the additional materials and labor required would make such a method of tiecoating cost prohibitive.

In the case where only one side of a board with two active sides is to be potted, while the second side remains clean, one may physically seal off the second side from the side to be potted, and place a preliminary potting compound on the first side to serve as a very thick tiecoat. However, as the tiecoat epoxies are expensive, and a separate potting operation is time intensive, this method is cost prohibitive. It also does not solve the problem of the board which requires further working since selective placement of the preliminary potting layer is difficult.

OBJECTS OF THE INVENTION

Per the above discussion, what is needed in the art is a method of economically applying a good tiecoat in a thin layer onto the ceramic substrate of the circuit board in a selective manner without obscuring the electrical/soldering connections in order that the board may be further worked and/or easily handled. In the case of two-sided boards where one side is not to be potted, it is also required that the tiecoat not obstruct the second side. Thus, it is among the objects of the present invention to provide for economical tiecoating of circuit boards, and especially thick film resistive network circuit boards that are to be potted. It is also among the objects of the present invention to provide for tiecoating of the circuit board substrate in only such areas as may require it, and without covering electrical/resistive contacts which need to be open or unobstructed to allow for further working of the board.

It is further among the objects of the present invention to provide for good dielectrics in a potted circuit assembly where the tiecoated board represents a part or component of the potting vessel wall.

BRIEF DESCRIPTION OF THE DRAWINGS

Other attendant advantages will be more readily appreciated as the invention becomes better understood by reference to the following detailed description and compared in connection with the accompanying drawings in which like reference numerals designate like parts throughout the figures. It will be appreciated that the drawings may be exaggerated for explanatory purposes.

FIG. 2 is a plan view of a first side of the thick film resistive network of FIG. 1 board containing an epoxy tiecoat according to the present invention.

FIG. 3 is a plan view of a second side of the thick film resistive network circuit board of FIG. 2 which is unobstructed by the tiecoat placed on the first surface.

FIG. 4 is a side cut-away view of a television sweep transformer according to a preferred embodiment of the invention in situ, before the board is placed to become a side of the potting vessel wall and before the bulk potting epoxy is applied.

FIG. 5 is a bottom-view of FIG. 4 taken along the line 5—5.

DESCRIPTION OF THE PREFERRED EMBODIMENT

Figure 1:
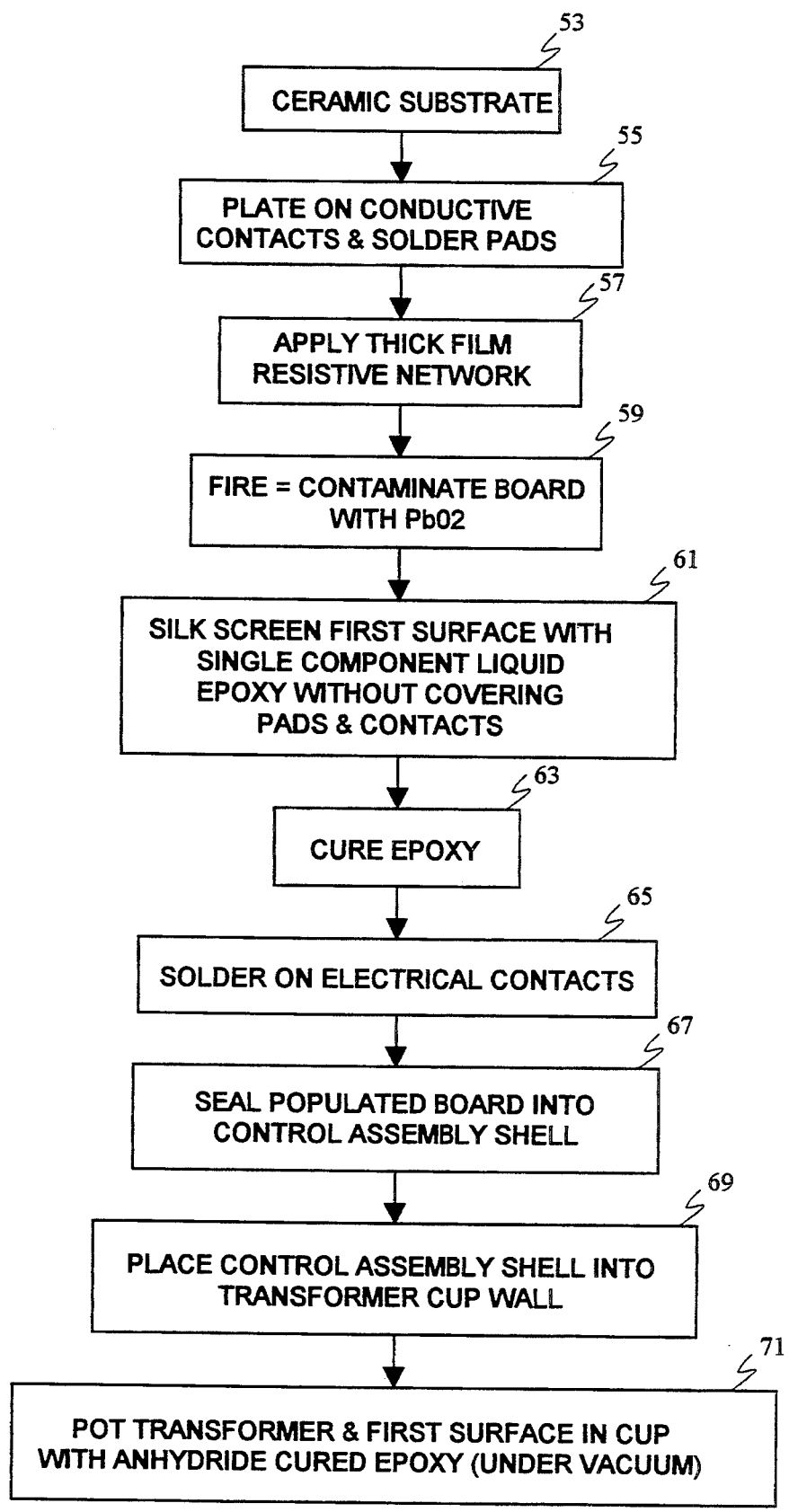
FIG. 1 is a flowchart for producing a potted circuit assembly such as a television sweep transformer with an attached G2/focus control assembly according to a preferred embodiment of the present invention.

As seen in FIG. 4, a sweep transformer assembly 11 for a cathode ray tube display comprises a cup 13 containing the sweep windings 15. The cup 13 has an open side 17 over which is fitted a G2/focus control assembly 19. The control assembly 19 comprises a control assembly shell 21 which carries the G2 potentiometer shaft and wiper 23 and the focus potentiometer shaft and wiper 25. Into the shell 21 is fitted the high voltage, resistive network circuit board 27.

The control assembly shell 21 is snap fit to the sweep transformer assembly cup 13 thereby coupling the resistive network circuit board 27 to the sweep windings 15 by the fitting of a clip 29 mounted on the board 27 over a pin 31 extending from sweep winding 15. The shell 21 and circuit board 27 then form a part of the wall of the cup 13 which surrounds the sweep windings 15.

Because the sweep transformer assembly 11 is a high voltage mechanism, the circuitry there must be potted, i.e., filled with epoxy (not shown) to provide an economical dielectric to prevent spark discharge within the assembly which would occur if the circuitry was left open to air.

As seen in FIG. 2, the "unpopulated" high voltage, resistive network circuit board 27 starts with the ceramic substrate 37, to the first side 33 of which is affixed a soldering pad 39 for the clip 29 (FIG. 4). Conductors and solder pads are shown in FIG. 2 and FIG. 3 with stipling. "Unpopulated" refers to a board without solderable electrical components, including wires, contacts, and active or passive discrete devices, thereon. A conductive run 41 extends from the soldering pad 39 to a thick film resistive network 43 also affixed to the ceramic substrate 37. Thick film resistors are shown in FIG. 2 and FIG. 3 with shading. The network 43 ends in a solder pad 45 for a feed through attachment of the focus control to the front of the board. The feed through is soldered closed to seal the first side of the board.

In order to insure proper adhesion of the potting epoxy to the resistive network circuit board 27, a tiecoat 47 is selectively screened over the resistive thick film run 43 and the conductive run 41 and the majority of the surface area of the ceramic substrate 37 while leaving open the solder pads 39 and 45 and through-holes 34, 36, 38, as indicated by the dashed line.

As seen in FIG. 3, the circuit board second side 35 contains a thick film resistive network for the G2 and focus control potentiometers 23, 25 interconnected by necessary conductive runs and solder pads 51. This second side 35 is not to be coated or obstructed by the tiecoat or the potting epoxy as will be readily understood by the artisan.

A suitable bulk potting epoxy would be an organic acid anhydride cured epoxy such as exemplified by the epoxy compositions disclosed and claimed in U.S. Pat. No. 4,923,908 to Lostumo et al, commonly owned herewith. While the organic acid anhydride cured epoxy compositions are economical and have good dielectric properties, by themselves they do not exhibit good adhesion to thick film resistive network circuit boards owing to surface contamination of the board by lead oxides resultant from the firing of the board to affix the thick film network thereon. Therefore, the epoxy composition for the tiecoat must be selected from those types which exhibit good adhesion to both the lead oxide contaminated circuit board and the potting epoxy which is used in bulk, while exhibiting suitable dielectric characteristics. In the preferred embodiment of the present invention, such an epoxy may be HYSOL EO1016 (TM), available from the Electronic Materials Division of The Dexter Corporation of Olean, N.Y. HYSOL EO1016 is a single component liquid epoxy which can be placed onto the fired, thick film resistive network circuit board in thin, economical layers. A placement method such as screen printing which also allows for patterning of the tiecoat to avoid solder pads or conductive runs which may need later working or attachment is desirable. HYSOL EO1016 is denominated by the manufacturer as an "encapsulant" for electronic components rather than a dielectric "ink" to be printed.

Turning now to FIG. 1, a flowchart for the making of a tiecoated, thick film resistive network circuit board; the artisan will begin at box 53 with the ceramic substrate 37 of appropriate size and composition for the potted circuit and its environment. In case of the sweep transformer assembly 11 of the present invention, the ceramic substrate is made mainly of alumina. One will then plate onto the ceramic substrate the conductive contacts, runs and solder pads, e.g. 39, 41, 51 etc., as at box 55. The thick film resistive networks are then applied in their appropriate shapes and sizes to form the resistive elements of the board, as at box 57. The board is then fired to affix the resistive network to the ceramic substrate as at box 59. This may result in the release of lead from the thick film, which settles onto the board and oxidizes as a contaminant which is not easily removed and which prevents good adhesion of the bulk potting epoxy.

Because of the environment of the above-described sweep transformer assembly 11, where only one side of the board is potted, i.e., the first side of the board which serves as part of the potting cup wall, the first surface of the board has a tiecoat. The tiecoat is applied as a single component liquid epoxy such as by screen printing in order to cover only those portions of the first surface as no longer need to be worked. This method leaves the second surface with its potentiometer resistive network free from any obstruction by the epoxy.

In the screen printing process of the preferred embodiment, the screen material will have a 200 or 250 mesh count, with a wire diameter of 1.6 mils, set at a 22½ degree angle to the frame. A printing machine capable of printing thixotropic materials such as an AMI-Presco Model 885 is used. Typical printing parameters for this machine include: a screen breakaway of 0.070", a squeegee of 60–80 durometer, a down stop of 0.010", squeegee pressure of 4–7 pounds, and squeegee speed of 1.5–3.5 inches/second. The tiecoat epoxy is silk screened on to provide a cured depth of approximately 1.5 to 2 mils, i.e., 0.0015–0.002 inch.

This thickness had been found to provide adequate tiecoat coverage and adhesion without the need for precleaning the board. Special precleaning may be needed if thinner coats are applied. Cured screened coats thicker than 3.0 mils may limit the mechanical bonding of the tiecoat to the substrate.

Other forms of liquid epoxy tiecoats might be suitably used including homopolymerized, amine or anhydride cured epoxies having suitable physical properties. Other forms of tiecoat placement such as direct contact printing or controlled nozzle spraying might be suitably utilized.

At box 63 the epoxy is then cured by placing the substrate on a belt which carries it through a four zone curing oven such as a BTU Engineering Co. Transheat Oven Model No. DR252-4-108D. Typical zone temperature settings are 190°, 230°, 240°, and 210° (C) with air flow settings of 90, 25, and 100 LPM. Belt speed is 15 inches/second. Minimum cure profile is 210° C. for approximately 2 minutes and 40 seconds.

The substrate now exists as a high voltage, resistive network circuit board with a tiecoat. The circuit board is ready to be further worked by soldering thereto any additional electrical components to form the completed, or populated, high voltage, resistive network circuit board as shown in FIG. 4, per box 65. The circuit board is then sealed into the control assembly shell 21 (FIG. 4), as at box 67. A bead of silicone rubber 68 (FIG. 4), an O-ring, or the like, is placed around the substrate 27 between the first side 33 and the second side 35 of the board in order to protect the second side 35 from the encroachment of the potting epoxy. Once the board 27 is sealed and secured in the control assembly shell 21, the control assembly shell 21 is secured to the open side 17 of the cupwall, thus closing the cup 13. The sweep transformer assembly 11 may then be potted. The potting epoxy is run through the sweep transformer assembly under a vacuum or other pressure differential thus filling all voids in the cup and providing a dielectric for the high voltage circuitry therein, as at box 71.

While the present invention has been illustrated and described in connection with the preferred embodiments, it is not to be limited to the particular structure shown, because many variations thereof will be evident to one skilled in the art and are intended to be encompassed in the present invention as set forth in the following claims:

What is claimed is:

1. A circuit assembly board useful in potted circuit applications comprising:
    a) a ceramic substrate with conductive runs, lead borosilicate resistive networks, and solder pads deposited thereon; and
    b) a dielectric tiecoat deposited selectively onto said substrate and over at least some of said conductive runs or resistive networks, or both, but not covering said solder pads; the dielectric tiecoat being selected for adhering both to the substrate and a subsequently applied potting compound.

2. The circuit assembly according to claim 1 wherein the dielectric is a single element liquid epoxy at room temperature.

3. The circuit assembly according to claim 2 wherein the single element liquid epoxy is selected from the group consisting of: amide cured, anhydride cured, homopolymerized cured, and amine cured epoxy resins.

4. The circuit assembly board according to claim 1 wherein the dielectric til coat is between 0.5 mils and 3.0 mils thick.

5. The circuit assembly board of claim 4 wherein the cured dielectric coat is approximately 2 mils thick.

6. The circuit assembly board according to claim 1 wherein the substrate has two major surfaces and both major surfaces of the substrate have deposited thereon conductive runs, resistive networks, and solder pads.

7. The circuit assembly board according to claim 6 wherein only one of said major surfaces is overcoated with a dielectric tiecoat.

* * * * *